(12) United States Patent
Foley

(10) Patent No.: US 11,055,172 B2
(45) Date of Patent: Jul. 6, 2021

(54) SYSTEMS, METHODS, AND APPARATUS TO DETECT ADDRESS FAULTS

(71) Applicant: Texas Instruments Incorporated, Dallas, TX (US)

(72) Inventor: David Peter Foley, Sugar Land, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 166 days.

(21) Appl. No.: 16/153,546

(22) Filed: Oct. 5, 2018

(65) Prior Publication Data

US 2020/0110659 A1    Apr. 9, 2020

(51) Int. Cl.
*G06F 11/10* (2006.01)
*G06F 11/07* (2006.01)

(52) U.S. Cl.
CPC ...... *G06F 11/1016* (2013.01); *G06F 11/0721* (2013.01); *G06F 11/0763* (2013.01); *G06F 11/1044* (2013.01); *G06F 11/1076* (2013.01)

(58) Field of Classification Search
None
See application file for complete search history.

(56) References Cited

U.S. PATENT DOCUMENTS

| | | | |
|---|---|---|---|
| 5,345,582 A | | 9/1994 | Tsuchiya |
| 5,392,302 A | * | 2/1995 | Kemp ................. G06F 11/1016 714/805 |
| 5,537,425 A | * | 7/1996 | Tsou ................... G06F 11/1016 714/799 |
| 7,380,200 B2 | * | 5/2008 | Dent ................... G06F 11/1048 714/805 |
| 2005/0149839 A1 | * | 7/2005 | Dent ................. H03M 13/2915 714/800 |
| 2014/0331110 A1 | | 11/2014 | Hwang et al. |
| 2018/0121274 A1 | * | 5/2018 | Speier .................. G06F 11/073 |

OTHER PUBLICATIONS

"Jew,Embedded Memory Design—Memories differentiate Microcontoller Solutions, 2017, VLSI Technology Symposium" (Year: 2017).*
"IBM Technical Disclosure Bulletin,Array Initialization With Address Fault Checking, Jul. 1979," (Year: 1979).*

(Continued)

*Primary Examiner* — April Y Blair
*Assistant Examiner* — Matthew W Wahlin
(74) *Attorney, Agent, or Firm* — Charles F. Koch; Charles A. Brill; Frank D. Cimino

(57) ABSTRACT

Methods, apparatus, systems and articles of manufacture are disclosed for safety mechanisms to actively detect address faults. An example system includes a first parity generator, a second parity generator, and a parity checker. The first parity generator is to generate a first parity based on a first address information. The first address information corresponds to a desired location to store data in a memory storage array. The second parity generator is to generate a second parity based on a second address information. The second address information corresponding to an actual location where the data is stored in the memory storage array. The parity checker is to compare the first parity and the second parity to detect a fault.

27 Claims, 5 Drawing Sheets

(56) References Cited

OTHER PUBLICATIONS

Thomas Jew, "Embedded Memory Design—Memories Differentiate Microcontroller Solutions", VLSI Technology Symposium, 2017, 41 pages.
Patent Cooperation Treaty, "International Search Report," issued in connection with Application No. PCT/US2019/054784, dated Jan. 23, 2020, 2 pages.
Patent Cooperation Treaty, "Written Opinion," issued in connection with Application No. PCT/US2019/054784, dated Jan. 23, 2020, 4 pages.

* cited by examiner

SYSTEMS, METHODS, AND APPARATUS TO DETECT ADDRESS FAULTS

FIELD OF THE DISCLOSURE

This disclosure relates generally to processing system faults and, more particularly, to systems, methods, and apparatus to detect address faults.

BACKGROUND

Microcontrollers are useful for automated processes that can be written into a coded set of instructions that the microcontroller can execute to carry out the desired process. For example, microcontrollers may be used in vehicle engine control systems, biomedical devices, remote controllers, appliances, electric power tools, etc.

Microcontrollers may contain at least one central processing unit (CPU) as well as memory and programmable input/output devices. The memory may be random access memory (RAM), ferroelectric random-access memory (FRAM), non-exclusive OR (NOR) flash, one-time programmable read only memory (OTP ROM), etc. The memory may be external to the CPU. Alternatively, the memory and the CPU may be native on the same device.

The ability to regulate various processes by controlling the passage of data between processors and memory makes microcontrollers an integral part of automated systems.

SUMMARY

Certain examples disclosed herein provide increased protection from faults that may occur between the initial generation of an address information and the decoding of that address information into specific word-line enable values and bit-line enable values. An example system includes a first parity generator, a second parity generator, and a parity checker. The first parity generator is to generate a first parity based on a first address information. The first address information corresponds to a desired location to store data in a memory storage array. The second parity generator is to generate a second parity based on a second address information. The second address information corresponding to an actual location where the data is stored in the memory storage array. The parity checker is to compare the first parity and the second parity to detect a fault.

Figure 1:
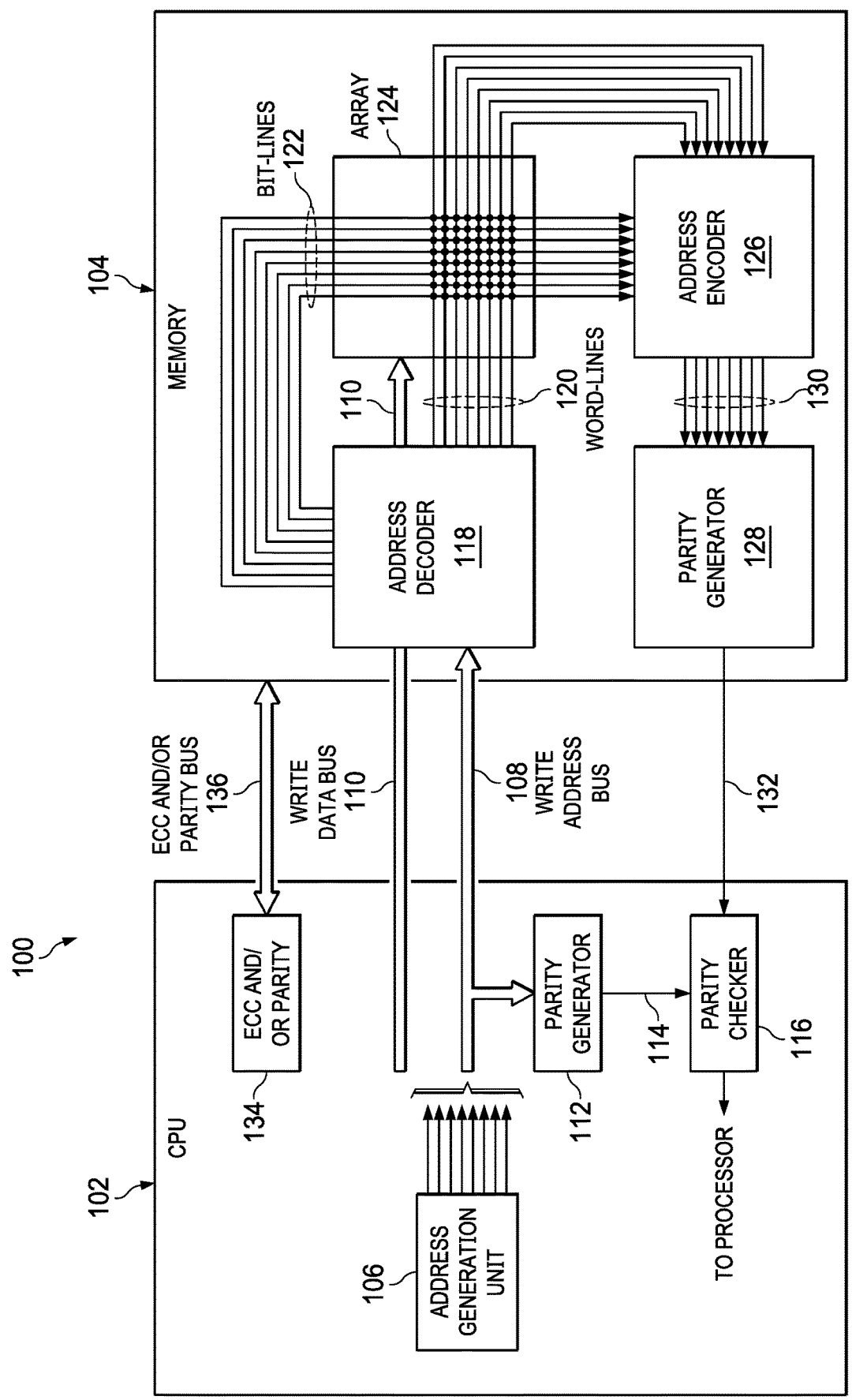
FIG. 1 is a block diagram illustrating an example fault detection system.

The figures are not to scale. In general, the same reference numbers will be used throughout the drawing(s) and accompanying written description to refer to the same or like parts. Although the figures show layers and regions with clean lines and boundaries, some or all of these lines and/or boundaries may be idealized. In reality, the boundaries and/or lines may be unobservable, blended, and/or irregular.

DETAILED DESCRIPTION

Microcontrollers play an essential role in the automation of processes. The processes can be redundant or critical to the success of an application; regardless of this, proper functionality of the microcontroller is paramount. Typical faults that occur in microcontrollers can arise from electrical or magnetic interference in a memory storage array or the peripheral devices supporting the memory storage array. These interferences can cause one or more bits in memory or logic to change state thereby causing a fault to occur. Typical solutions to these faults are error correcting code (ECC) and parity logic and/or software. These solutions work well under the assumption that the data was written to the correct address and are often accompanied by a read back of the written data after writing. However, even if the address information presented by the CPU is included into the ECC and/or parity logic generation algorithm, if a permanent fault exists in the address path, there is no guarantee that the detection scheme will be able to sense the fault and alert the processor to employ fault correcting procedures without significant delay. The ECC and parity logic and/or software may be, for example, data parity, data and address parity, data ECC, or data and address ECC.

The traditional method of detecting permanent address faults involves testing the memory during startup to make sure the address locations are correct. However, this method is only capable of detecting faults that occurred since the last start-up procedure. Furthermore, the start-up procedure may be infrequently executed, and thus permanent faults may remain undetected for extended periods of time.

For example, the CPU may intend to write some data to a first address, but a fault is present in the address path or logic. This fault will cause the data to be written to a second address instead. If the fault is a transient fault, then the traditional read-after-write method mentioned above would read the data stored at the first address and recognize that the stored data at the first address is not the same data that was transmitted on the write process. However, if the fault is a permanent fault that occurs between the CPU and the ECC and/or parity logic and/or software, the traditional method will perceive that it is reading the data stored at the first address, but it will really be reading the data that is stored at the second address. In the case where the permanent fault occurs between the CPU and the ECC and parity logic and/or software, the data at the second address will be overwritten with the data intended for the first address. The CPU will be unable to determine that the data at the second address has been overwritten and this can cause unsafe conditions in an application.

Another case of a permanent fault is one in which the fault occurs between the ECC and/or parity logic and/or software and the memory. In this case, the traditional method would perceive that the data intended for the first address was stored at the first address, even though it was stored at the second address. When the second address is read by the CPU, the CPU would note that the data stored at the second address was not the correct data for that address. While this type of permanent fault would eventually be caught by the traditional methods, detection would be delayed and leave the application open to unsafe conditions.

To address permanent faults that occur between the CPU and the memory cell the data is stored in, a parity generator may be included in the processor as well as in the memory to generate at least two parities from the address information used in the processor as well as the address information where data is stored in the memory. The processor can then use a parity checker to compare the two or more parity values and determine if a permanent fault has occurred between the address information generation and the address information where the data is stored in the memory. The proposed method of generating a first parity for the address information generated in the processor and comparing that parity to a second parity generated from the address information used to store data in the memory may be used in conjunction with the traditional methods of ECC and parity logic and/or software.

FIG. 1 is a block diagram of an example fault detection system 100 that can be implemented in accordance with the teachings of this disclosure to perform fault detection of an example memory storage array 124. The fault detection system 100 may include example processor 102 and example memory 104. In the illustrated example, the processor 102 is an example central processing unit (CPU) and the memory 104 is, for example, RAM. Alternatively, the memory 104 may be any other type of volatile or non-volatile memory or logic register.

In the illustrated example of FIG. 1, the CPU 102 may include an example address generation unit 106.

The address generation unit 106 is coupled to an example write address bus 108. The write address bus 108 conveys information identifying a desired location, known as an address information, to write data to the memory 104. The data is to be written to the memory 104 by an example write data bus 110. The write address bus 108 is also coupled to an example CPU parity generator 112. The CPU parity generator 112 is coupled to an example parity checker 116 by the CPU parity generator output 114. The parity checker 116 is then coupled to a part of the CPU 102 that is external to the parity checker 116. The CPU 102 also includes ECC and/or parity logic and/or software 134 that is coupled to the memory 104 by the example ECC and parity bus 136. The coupling between different components listed above can be either wired or wireless depending on the application.

In the illustrated example of FIG. 1, the CPU 102 includes the address generation unit 106. In some examples, the address generation unit 106 functions to perform the necessary calculations to address data operands in the CPU and generate addresses. The address generation unit 106 includes four sets of register triplets as well as a full adder, an offset adder, and a modulo adder. The register triplets each include an address register, an offset register, and a modifier register. The adders function in conjunction with the registers to perform operations upon the information stored in the registers to generate address information. The address generation unit 106 may represent the information as a variety of datatypes including hashed values, binary values, hexadecimal values, etc.

In the illustrated example, the CPU 102 includes the CPU parity generator 112 that determines at least one parity bit from a certain input data type. As explained below, the parity bit is used to check for single-bit errors in the data from which the parity bit is generated. The CPU 102 also includes a parity checker 116 that compares at least two parity bits from two different parity generators. After comparing the parity bits, the parity checker 116 is to communicate with a different portion of the CPU 102 and communicate the result of the parity check.

In the illustrated example of FIG. 1, the write address bus 108 and the write data bus 110 can be implemented in a variety of ways. The write address bus 108 and the write data bus 110 transmit address information and data to a desired location in a memory storage array 124. Example implementations of the address and data busses may include using one wire for each data or address information value on the bus, using multiplexers as a method of reducing the complexity of the wiring configuration, etc.

In the illustrated example, the memory 104 includes an address decoder 118, a memory storage array 124, an address encoder 126, and a memory parity generator 128. The address decoder 118 is coupled to the write address bus 108 and is coupled to the memory storage array 124 by the word-lines 120 and the bit-lines 122. The memory storage array 124 is coupled to the address encoder 126 by the word-lines 120 and the bit-lines 122. The address encoder 126 is also coupled to the memory parity generator 128. The memory parity generator 128 is coupled to the parity checker 116 in the CPU 102.

The address decoder 118 may include hardware or software elements to convert the datatype of the address information to the required input datatype for the memory storage array 124. This conversion may be done through the use of physical logic gates or through the use of Boolean algebra in software. As a hardware implementation, the address decoder 118 may include a number of demultiplexers that convert the signals on the write address bus 108 into a greater number of signals that are then used to energize the word-lines 120 and the bit-lines 122.

The energized word-lines 120 and bit-lines 122 create a set of word-line enable values and a set of bit-line enable values that are used to specify an actual location in the memory storage array 124 for storage of the information on the write data bus 110.

In the illustrated example of FIG. 1, the memory storage array 124 may be a programmable logic array, field programmable gate array, etc. that is used in the memory 104. The memory 104 may be implemented as a dynamic random-access memory (DRAM), static random-access memory (SRAM), hard drive, etc. In the illustrated example, the word-lines 120 and the bit-lines 122 are used as designators for row-column pairs that select specific address information in the memory storage array 124 to store data. The memory storage array 124 may be used in an example memory 104 that is DRAM. If the example memory storage array 124 is DRAM, then it may include several switches and capacitors. The switches may be transistors such as metal oxide semiconductor field effect transistors (MOSFET), bipolar junction transistors (BJT), junction gate field effect transistors (JFET), heterojunction bipolar transistors (HBT), etc. The usage of a transistor and capacitor together forms a memory cell which corresponds to a single bit of data. The word-lines 120 and the bit-lines 122 are used to specify the location of individual memory cells in which to store data. The capacitors in the example memory storage array 124 may experience leakage over time that would compromise the data that is stored in them and may require re-charging to maintain stored data after a read event. This is done by the re-energizing of the word-lines 120 and the bit-lines 122 to recharge the capacitors in the memory storage array 124. This repeated re-energization can cause strain on the word-lines 120 and bit-lines 122 and eventually cause faults to occur on the word-lines 120 and/or bit-lines 122.

In the illustrated example of FIG. 1, the memory 104 includes the address encoder 126 that will encode the information on word-lines and bit-lines, 120 and 122 respectively. The particular set of word-lines 120 and bit-lines 122 that are enabled become word-line enable values and bit-line enable values that are then to be encoded into address information by the address encoder 126. For example, the word-line enable values and bit-line enable values on the word-lines 120 and the bit-lines 122 are input (e.g. the values are input) into a multiplexer to reduce the size of the address information being sent to the memory parity generator 128 on the address check bus 130. After the re-encoded address information is sent to the memory parity generator 128, the output of the memory parity generator 128 is to be sent parity checker 116. The memory parity generator 128 is coupled to the parity checker 116 so that the output from the memory parity generator 128 may be compared to the parity generated from the CPU parity generator 112 in the CPU 102. In other words, if there are no faults, the output from the address encoder 126 will match the output from the address generation unit 106. The generation of a parity in the CPU 102 by the CPU parity generator 112, the generation of a parity in the memory 104 by the memory parity generator 128, and the comparison of the two parities by the parity checker 116 will allow for proper fault detection of faults that occur between the CPU 102 and the location where data is stored.

In the illustrated example of FIG. 1, the fault detection system 100 actively detects faults on address lines. The desired address information to store data in the memory 104 is initially calculated by the address generation unit 106. This address information corresponds to the desired location to store the data on the write data bus 110. The address information is then sent to the write address bus 108 and sent to the memory 104 as well as to the CPU parity generator 112. The CPU parity generator 112 generates one or more parity bits from the encoded address information on the write address bus 108. The one or more parity bits are sent to the parity checker 116.

In the memory 104, the address decoder 118 receives the address information from the write address bus 108. The address decoder 118 decodes the address information through the use or hardware or software. The decoded address information generates word-line enable values and bit-line enable values on the word-lines 120 and bit-lines 122 that determine the actual address information where the data on the write data bus 110 is to be stored. The word-line enable values and bit-line enable values are then encoded through the use of hardware or software by the address encoder 126. This address information is sent to the memory parity generator 128 on the address check bus 130. The memory parity generator 128 generates one or more parity bits from the address information it receives.

The one or more parity bits are sent to the parity checker 116 in the CPU 102 over the memory parity generator output 132. The one or more parity bits generated by the memory parity generator 128 are compared to the one or more parity bits generated by the CPU parity generator 112. The result is then sent to a part of the CPU 102 that is external from the parity checker 116. The result of the comparison in the parity checker 116 may be a digital high value or a digital low value. For example, if the result is a digital high value and the CPU 102 is designed such that a digital high value corresponds to a Boolean true value, the CPU 102 will be notified that a fault has occurred. Alternatively, if the CPU 102 is designed such that a digital high value corresponds to a Boolean false value, then the CPU 102 will be notified that no fault has occurred. If no fault has occurred, the CPU 102 will continue to check for faults. However, if a fault has occurred, the CPU 102 will enact software to mitigate the effects of the error on the application.

Figure 2:
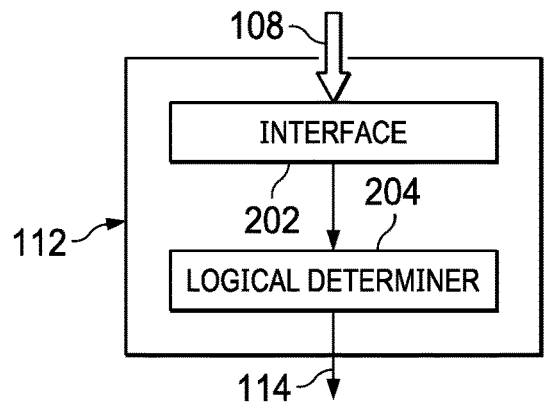
FIG. 2 is a block diagram illustrating an example CPU parity generator.

FIG. 2 is a block diagram of the example CPU parity generator 112 of FIG. 1. The CPU parity generator 112 included an example interface 202 and an example logical determiner 204. In the example, the interface 202 is coupled to the write address bus 108 and the logic determiner 204. The logical determiner 204 may be coupled to the parity checker 116 by the CPU parity generator output 114. The coupling between different components listed above can be either wired or wireless depending on the application.

In the illustrated example of FIG. 2, the interface 202 may be implemented in hardware as the connection between the write address bus 108 and the CPU parity generator 112. The interface 202 may separate the address information on the write address bus 108 into sections of 8 bits of information. The interface 202 may alternatively be implemented as software that fulfills the same function. The interface 202 may be connected to various datatypes including binary, hexadecimal, octal, etc. The interface 202 may convert one of the datatypes to whichever datatype the logical determiner 204 may take as an input.

In the illustrated example, the logical determiner 204 may be implemented as a set of individual exclusive OR (XOR) gates or as a software Boolean equation that reduces the input value into at least one parity bit or as another type of software that would reduce the input data to a set of parity bits. When implemented with XOR gates, the logical determiner 204 may hash groups of eight bits together to form a single parity bit for each group.

Figure 3:
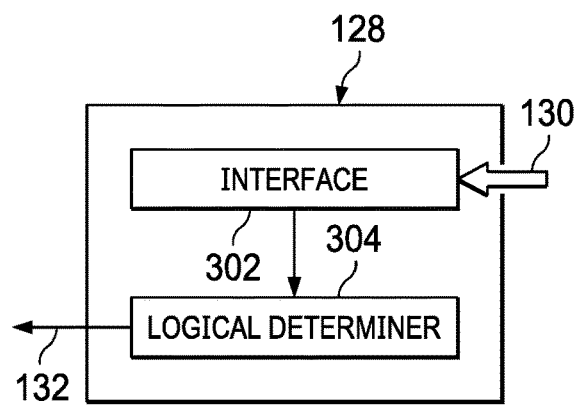
FIG. 3 is a block diagram illustrating an example memory parity generator.

FIG. 3 is a block diagram of the example memory parity generator 128 of FIG. 1. The memory parity generator 128 may include an example interface 302 and an example logical determiner 304. The interface 302 may be coupled to the address check bus 130. The logical determiner 304 is further coupled to the parity checker 116 by the memory parity generator output 132. The coupling between different components listed above can be either wired or wireless depending on the application.

In the illustrated example of FIG. 3, the interface 302 may be implemented in hardware as the connection between the write address bus 130 and the memory parity generator 128. The interface 302 may separate the address information on the write address bus 130 into sections of 8 bits of information. The interface 302 may alternatively be implemented as software that fulfills the same function. The interface 302 may be connected to various datatypes including binary, hexadecimal, octal, etc. The interface 302 may convert one of the datatypes to whichever datatype the logical determiner 304 may take as an input.

In the illustrated example, the logical determiner 304 may be implemented as a set of individual exclusive OR (XOR) gates or as a software Boolean equation that reduces the input value into at least one parity bit or as another type of software that would reduce the input data to a set of parity bits. When implemented with XOR gates, the logical determiner 304 may hash groups of eight bits together to form a single parity bit for each group.

Figure 4:
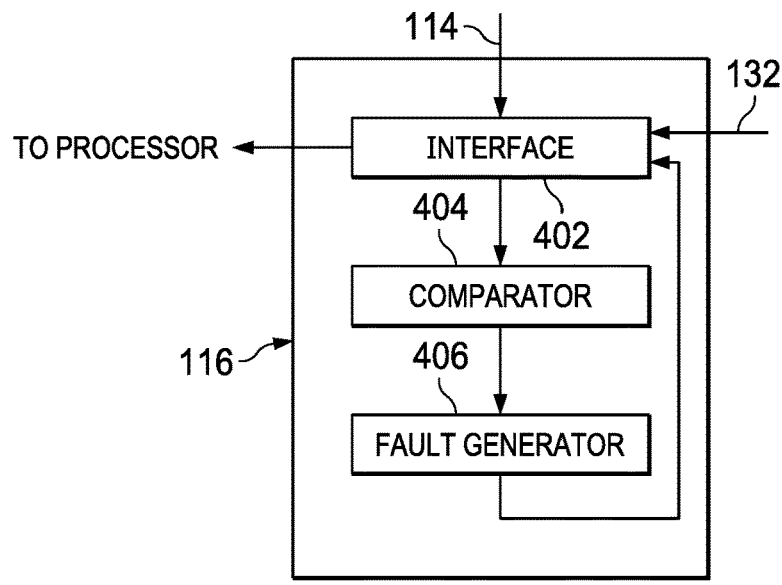
FIG. 4 is a block diagram illustrating an example parity checker.

FIG. 4 is a block diagram of the example parity checker 116 of FIG. 1. The parity checker 116 includes an example interface 402, an example comparator 404, and an example fault generator 406. The interface 402 is coupled to a part of the CPU 102 that is external to the parity checker 116, the CPU parity generator output 114, the memory parity generator output 132, etc. The coupling between different components listed above can be either wired or wireless depending on the application.

In the illustrated example of FIG. 4, the interface 402 is coupled to the CPU parity generator output 114, the memory parity generator output 132, a part of the CPU 102 that is external to the parity checker 116, and the comparator 404. The interface 402 is to take the CPU parity generator output 114 and the memory parity generator output 132 as inputs and send the parity values corresponding to the two parity generators to the comparator 404. In other implementations, the interface 402 may receive the address information as well as the parity bit from the CPU parity generator 112 and the memory parity generator 128. In the previously mentioned implementation, the interface 402 may separate the parity bit from the address information for the input that is received from the CPU parity generator 112 and for the input that is received from the memory parity generator 128. The coupling between different components listed above can be either wired or wireless depending on the application.

In the illustrated example of FIG. 4, the comparator 404 is coupled to the interface 402 and the fault generator 406. The comparator 404 may be implemented as hardware and/or software. In a hardware implementation, XOR logic gates may be used to compare two or more parity bits and generate a result and send that information to the fault generator 406. In a software implementation of the comparator 404, a set of Boolean algebra equations may be used to compare at least two parity bits together and then send that result to the fault generator 406. The coupling between different components listed above can be either wired or wireless depending on the application.

In the illustrated example, the fault generator 406 is coupled to the comparator 404 and the interface 402. The fault generator 406 may be implemented as hardware or in software. As a hardware implementation, the fault generator 406 may be a set of logic gates that generate a high-level or low-level signal to be sent to the interface 402. When implemented in software, the fault generator 406 may be an else/if statement that is subject to the output of the comparator 404. The output from the fault generator 406 is to be sent to the interface 402 so that the interface 402 may communicate to a part of the CPU 102 that is external to the parity checker 116. The coupling between different components listed above can be either wired or wireless depending on the application.

The CPU parity generator 112, the memory parity generator 128, and the parity checker 116 allow for the greatest coverage for word-line and bit-line faults while allowing fault detection during the runtime of an application (e.g. used during runtime), whereas previous solutions could only be implemented during the start-up or shutdown of an application due to the destructive nature of prior solutions. Previous solutions are destructive because the memory must be disabled from functional use in order for the previous solution to carry out a full test uninterrupted. This significantly affects system performance because the memory that is being tested is not available for a substantial amount of time. Conversely, when using the CPU parity generator 112, the memory parity generator 128 and the parity checker 116, the memory 104 is fully functional while monitoring for faults and system performance is not impaired as it is by the previous solutions. The CPU parity generator 112, the memory parity generator 128, and the parity checker 116 provide adaptive, on-the-fly feedback for address information to the CPU 102. The CPU parity generator 112, the memory parity generator 128, and the parity checker 116 improve the efficiency of using a computing device by closing the loop between address information generation in the CPU 102 and address information use in the memory 104 of a processing system. This allows for increased protection for faults that may occur between the initial generation of address information in the CPU 102 and the decoding of that address information into specific word-line enable values and bit-line enable values in the memory 104.

While an example manner of implementing the fault detection system 100 of FIG. 1 is illustrated in FIGS. 2, 3, and 4, one or more of the elements, processes and/or devices illustrated in FIGS. 2, 3, and 4 may be combined, divided, re-arranged, omitted, eliminated and/or implemented in any other way. Further, the example CPU parity generator 112, the example memory parity generator 128, the example parity checker 116, and/or, more generally, the example the fault detection system 100 of FIG. 1 may be implemented by hardware, software, firmware and/or any combination of hardware, software and/or firmware. Thus, for example, any of the example CPU parity generator 112, the example memory parity generator 128, the example parity checker 116, and/or, more generally, the example fault detection system 100 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example CPU parity generator 112, the example memory parity generator 128, the example parity checker 116, and/or the example fault detection system 100 is/are hereby expressly defined to include a non-transitory computer readable storage device or storage disk such as a memory, a digital versatile disk (DVD), a compact disk (CD), a Blu-ray disk, etc. including the software and/or firmware. Further still, the example fault detection system 100 of FIG. 1 may include one or more elements, processes and/or devices in addition to, or instead of, those illustrated in FIGS. 2, 3, and 4, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 5:
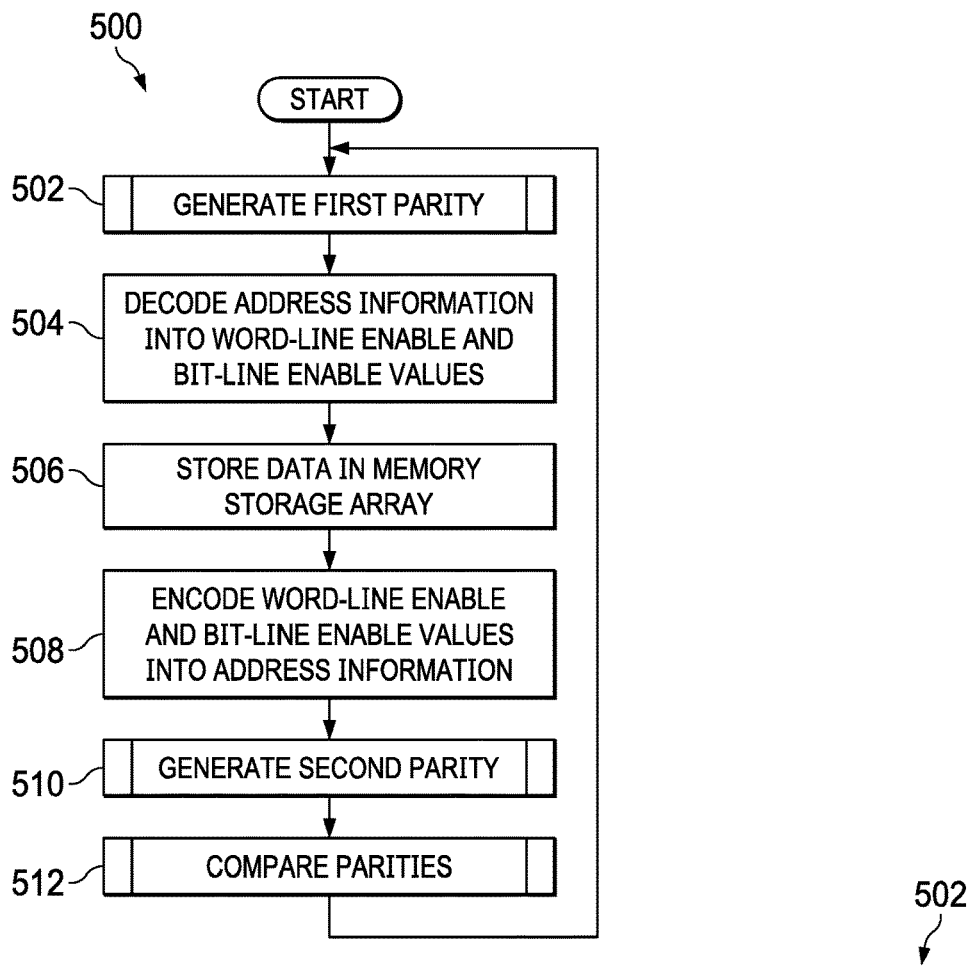
FIG. 5 is a flowchart representative of machine readable instructions which may be executed to implement the fault detection system of FIG. 1.

A flowchart representative of example hardware logic, machine readable instructions, hardware implemented state machines, and/or any combination thereof for implementing the fault detection system of FIG. 1 is shown in FIG. 5. The machine readable instructions may be an executable program or portion of an executable program for execution by a computer processor such as the processor 912 shown in the example processor platform 900 discussed below in connection with FIG. 9. The program may be embodied in software stored on a non-transitory computer readable storage medium such as a CD-ROM, a floppy disk, a hard drive, a DVD, a Blu-ray disk, or a memory associated with the processor 912, but the entire program and/or parts thereof could alternatively be executed by a device other than the processor 912 and/or embodied in firmware or dedicated hardware. Further, although the example program is described with reference to the flowchart illustrated in FIG. 5, many other methods of implementing the example fault detection system 100 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

As mentioned above, the example processes of FIGS. 1, 2, 3, and 4 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one of A and at least one of B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least A, (2) at least B, and (3) at least A and at least B. Similarly, as used herein in the context of describing the performance or execution of processes, instructions, actions, activities and/or steps, the phrase "at least one of A or B" is intended to refer to implementations including any of (1) at least A, (2) at least B, and (3) at least A and at least B.

The program of FIG. 5 shows the process 500 to carry out the fault detection system 100 of FIG. 1. The process 500 includes the block 502 which is the start of the process 500. The block 502 is the block that may instruct the processor to generate a first parity. The process 500 may correspond to the example CPU parity generator 112 of FIG. 2. At block 502, the CPU parity generator 112 is to generate the first parity bit which is associated with a first address information. The first address information is associated with the data operands (e.g. based on data operands) in the CPU 102 of FIG. 1. The first address information is sent to the memory 104 by the write address bus 108. The first address information may be a desired location in which the data on the write data bus 110 is to be stored in the memory 104.

The process 500 includes block 504 which is the block that instructs the processor to decode the first address information into word-line enable values and bit-line enable values. These word-line enable values and bit-line enable values correspond to the word-lines 120 and bit-lines 122 of the memory 104 of FIG. 1. Block 504 may correspond to the example hardware implementation of FIG. 1, where block 504 may be carried out in hardware as the address decoder 118.

The process 500 includes block 506. Block 506 is the block that instructs the processor to store data in a memory storage array. The memory storage array may correspond to the memory storage array 124 of FIG. 1 and the data may correspond to the data on the write data bus 110 of FIG. 1.

The process 500 further includes block 508. Block 508 is the block that instructs the processor to re-encode the word-line enable values and bit-line enable values into a second address information. This second address information corresponds to the word-line enable values and the bit-line enable values on the word-lines 120 and bit-lines 122. This second address information is an actual location where data is stored in a memory storage array. Block 508 may correspond to the example hardware implementation of FIG. 1, where block 508 is implemented as the example address encoder 126. The memory storage array where data is stored may correspond to the memory storage array 124 of FIG. 1.

The process 500 includes block 510 which is the block that instructs the processor to generate a second parity bit based off the second address information. This parity bit corresponds to the word-line enable values and bit-line enable values on the word-lines 120 and bit-lines 122. Block 510 may correspond to the example memory parity generator 128 of the example memory 104 of FIG. 1.

The process 500 also includes block 512 which is the block that instructs the processor to compare the first parity bit which corresponds to the first address information and the second parity bit which corresponds to the second address information. Block 512 may correspond the example parity checker 116 of FIG. 1.

Figure 6:
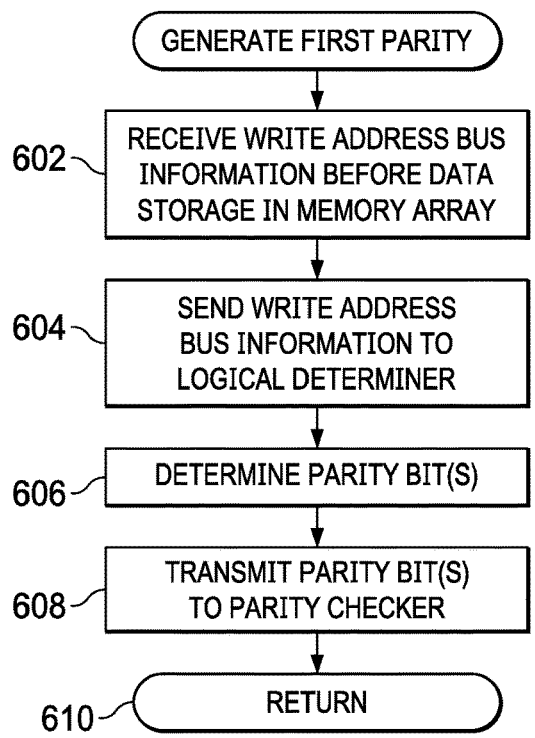
FIG. 6 is a flowchart representative of machine readable instructions which may be executed to implement the CPU parity generator of FIG. 2.

The process of FIG. 6 shows the sub-process 600 which may be used to implement the block 502 of the process 500 shown in FIG. 5. The sub-process 600 is shown in an example hardware implementation in FIG. 1 by the CPU parity generator 112 which is shown in detail in FIG. 2. The sub-process 600 is to instruct the processor to generate a parity bit based off of a first address information in the CPU 102. The first address information corresponds to data operands in the CPU 102 that are used by the address generation unit 106 shown in FIG. 1.

The sub-process 600 begins at the block 602 which specifies that the first address information is received from the write address bus before data is stored in the memory storage array. The memory storage array may correspond to the memory storage array 124 of the memory 104 in the example fault detection system 100 of FIG. 1. The first address information may be on the write address bus 108. Block 602 may be carried out by the interface 202 of the example CPU parity generator 112 shown in FIG. 2.

The next block in the sub-process 600 is block 604 which is the block that instructs the interface 202 of the example CPU parity generator 112 to send the address information to the logical determiner 204 of FIG. 2. Block 604 may represent the coupling between the interface 202 and the logical determiner 204 of FIG. 2.

Next in the sub-process 600 is block 606 which is the block that determines a parity bit or parity bits for an address information that is sent to it. The block 606 may be carried out in hardware as the logical determine 204 in the CPU parity generator 112 of FIG. 2. The number of parity bits that are determined is based on the size of the address information. Parity bits are typically determined for each set of 8 bits of information. For example, the data input into the CPU parity generator 112 is to be separated by the interface 202 into 8-bit segments for use by the logical determiner 204. For a 32-bit address information, the logical determiner 204 would determine 4 parity bits.

Next in the sub-process 600 is the block 608 which is the block that sends the determined parity bits to the parity checker. The parity checker may correspond to the parity checker 116 of the CPU 102 of FIG. 1. The block 608 may be represented in hardware as the CPU parity generator output 114. Next in the sub-process 600 is the block 610 which is the block that instructs the sub-process 600 to return to the process 500 of FIG. 5.

Figure 7:
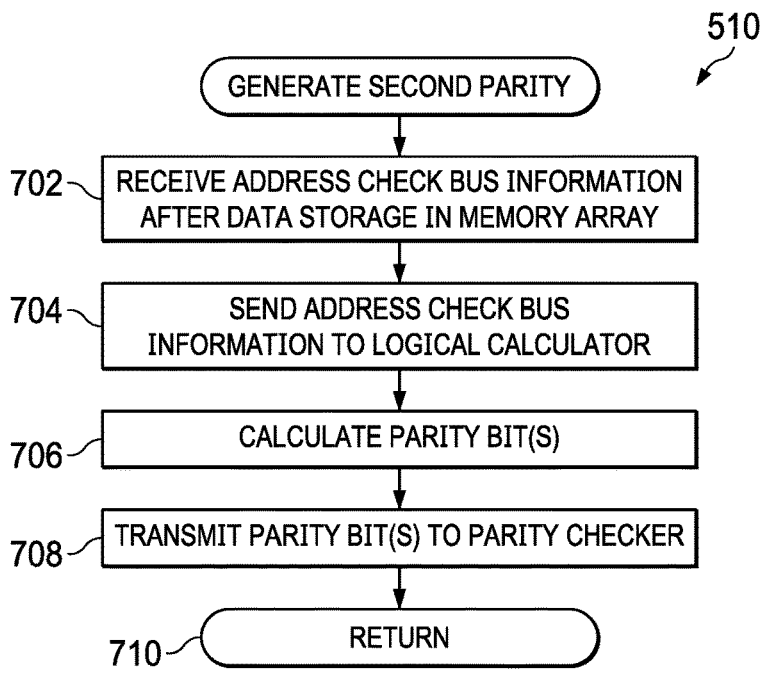
FIG. 7 is a flowchart representative of machine readable instructions which may be executed to implement the memory parity generator of FIG. 3.

The process of FIG. 7 shows the sub-process 700 which may be used to implement the block 510 of process 500 shown in FIG. 5. The sub-process 700 is shown in an example hardware implementation in FIG. 1 by the memory parity generator 128 which is shown in detail in FIG. 3. The sub-process 700 may instruct the processor to generate a parity bit based off of a second address information in the memory 104. The second address information corresponds to word-line enable values and bit-line enable values that correspond to the word-lines 120 and the bit-lines 122 in the memory 104 shown in FIG. 1.

The sub-process 700 begins at the block 702 which specifies that the second address information is received on the address check bus after the data is stored in the memory storage array. The address check bus may correspond to the address check bus 130 of FIG. 1. The memory storage array may correspond to the memory storage array 124 of the memory 104 of FIG. 1. Block 702 may be carried out by the interface 302 of the example memory parity generator 128 shown in FIG. 3.

The next block in the sub-process 700 is block 704 which is the block that instructs the interface 302 of the example memory parity generator 128 to send the address information to the logical determiner 304 of FIG. 3. Block 704 may represent the coupling between the interface 302 and the logical determiner 304 of FIG. 3.

Next in the sub-process 700 is block 706 which is the block that determines a parity bit or parity bits for an address information that is sent to it. The block 706 may be carried out in hardware as the logical determiner 304 in the memory parity generator 128 of FIG. 3. The number of parity bits that are determined is based on the size of the address information. Parity bits are typically determined for each set of 8 bits of information. For example, the data input into the memory parity generator 128 is to be separated by the interface 302 into 8-bit segments for use by the logical determiner 304. For a 32-bit address information, the logical determiner 304 would determine 4 parity bits.

Next in the sub-process 700 is the block 708 which is the block that sends the determined parity bits to the parity checker. The parity checker may correspond to the parity checker 116 of the CPU 102 of FIG. 1. The block 708 may be represented in hardware as the memory parity generator output 132. Next in the sub-process 700 is the block 710 which is the block that instructs the sub-process 700 to return to the process 500 of FIG. 5.

Figure 8:
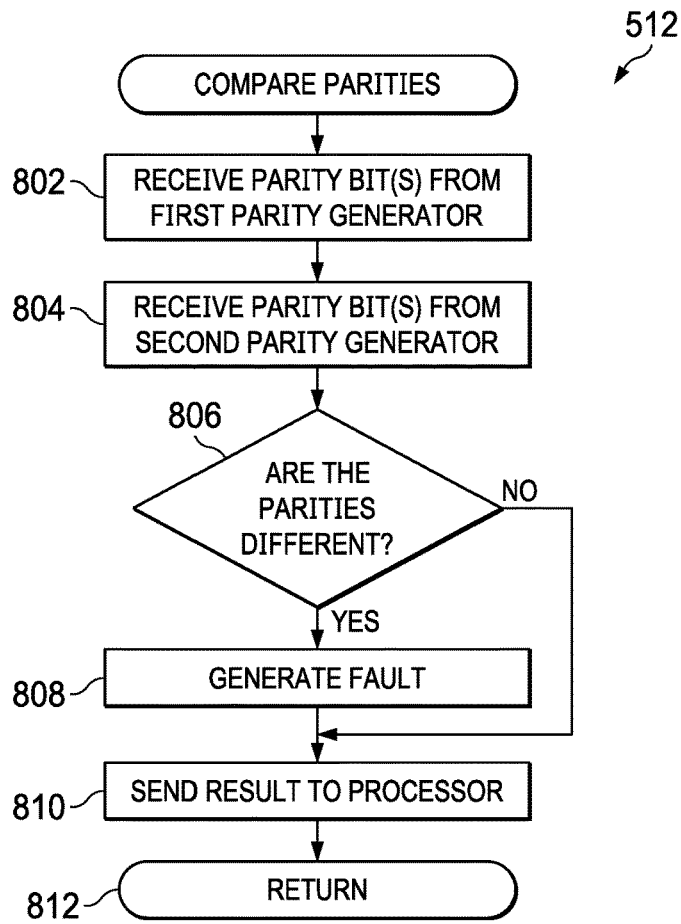
FIG. 8 is a flowchart representative of machine readable instructions which may be executed to implement the parity checker of FIG. 4.

The process of FIG. 8 shows the sub-process 800 which may be used to implement the block 512 of process 500 shown in FIG. 5. The sub-process 800 is shown in an example hardware implementation in FIG. 1 by the parity checker 116 which is shown in detail in FIG. 4. The sub-process 800 may instruct the processor to compare two or more parity bits.

The sub-process 800 begins at the block 802 which specifies that the processor receives the first parity bit(s) from the first parity generator. The first parity generator may correspond to the CPU parity generator 112 shown in FIG. 2. The next block in the sub-process 800 is the block 804 which specifies that the processor receives the second parity bit(s) from the second parity generator. The second parity generator may correspond to the memory parity generator 128 shown in FIG. 3. An example implementation of the sub-process 800 is shown in FIG. 4, wherein blocks 802 and 804 of the sub-process 800 may be carried out by the interface 402.

Next in the sub-process 800 is block 806 which is the block that compares the two or more parity bits and specifies whether or not the two or more parity bits are different. The block 806 of the sub-process 800 may be implemented as the comparator 404 in the example parity checker 116 of FIG. 4. If the block 806 compares the two or more parity bits and specifies that the two or more parity bits are different, then the sub-process 800 moves onto block 808, if not, the sub-process 800 moves onto block 810.

In the sub-process 800, the block 808 is the block that generates a fault which specifies that the two or more parity bits are different. The fault denotes that the first address information is different from the second address information. The first address information corresponding to data operands in the CPU 102 that are used by the address generation unit 106. The second address information corresponding to the set of word-line enable values and the set of bit-line enable values and the actual location where the data is stored. Block 808 may be implemented as the fault generator 406 of FIG. 4.

The sub-process 800 then passes from block 808 to block 810. Block 810 is the block that sends the result of comparing the two or more parity bits to a part of the processor that is external from the parity checker. To accomplish this, the result may first be sent to the interface 402. The interface 402 may then send the result of the comparison to a part of the CPU 102 that is external to the parity checker 116. From the value of this result, the CPU 102 may determine whether or not to enact safety protocols for faults. The safety protocols for faults are to mitigate the effects of a fault and to prevent unsafe conditions in an application. The next block in sub-process 800 is the block 812 which is the block that instructs the sub-process 800 to return to the process 500 of FIG. 5.

Figure 9:
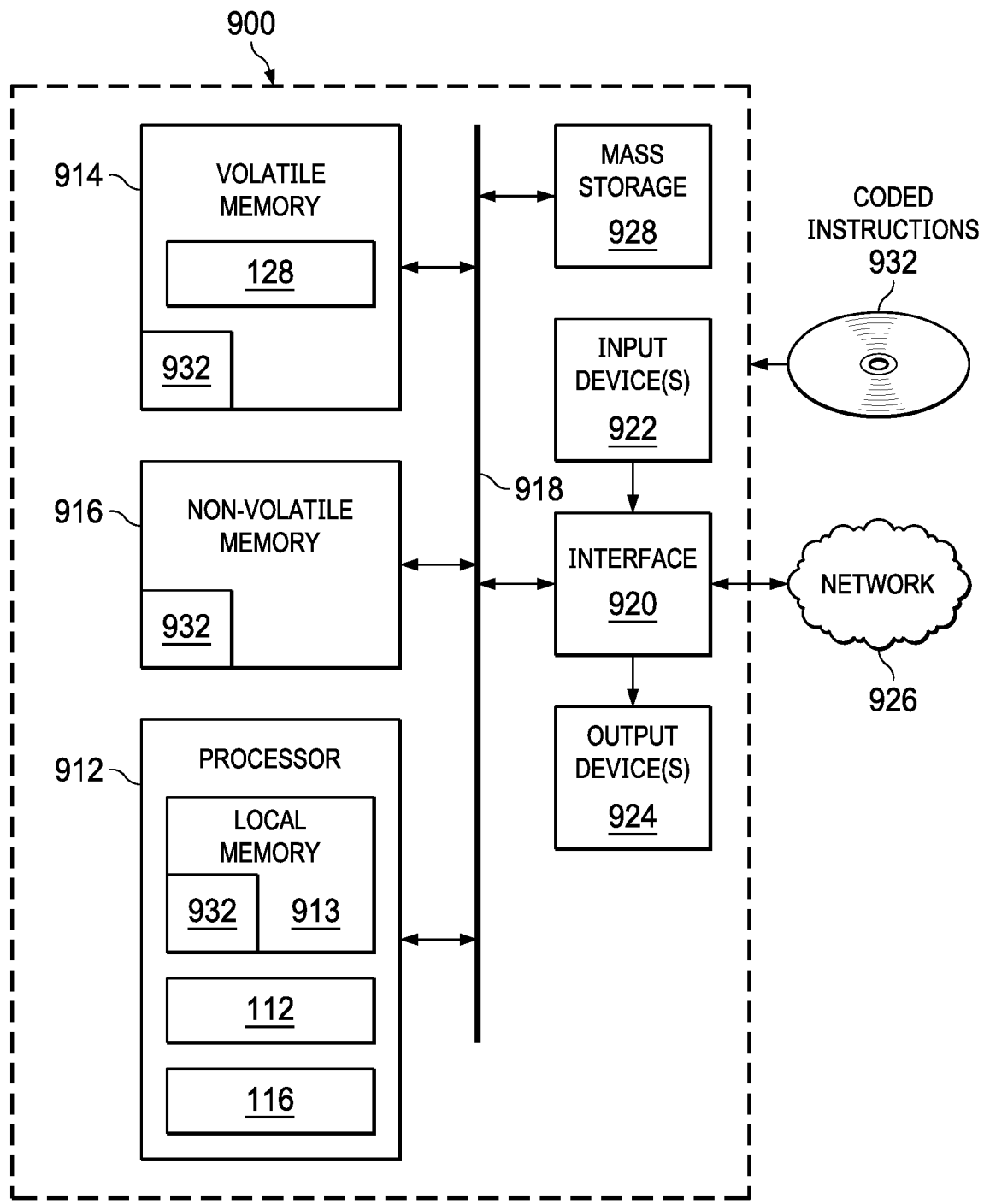
FIG. 9 is a block diagram of an example processing platform structured to execute the instructions of FIGS. 5, 6, 7, and 8.

FIG. 9 is a block diagram of an example processor platform 900 structured to execute the instructions of FIGS. 5, 6, 7, and 8 to implement the system of FIG. 1. The processor platform 900 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset or other wearable device, or any other type of computing device.

The processor platform 900 of the illustrated example includes a processor 912. The processor 912 of the illustrated example is hardware. For example, the processor 912 can be implemented by one or more integrated circuits, logic circuits, microprocessors, GPUs, DSPs, or controllers from any desired family or manufacturer. The hardware processor may be a semiconductor based (e.g., silicon based) device. In this example, the processor implements the CPU parity generator 112 and the parity checker 116.

The processor 912 of the illustrated example includes a local memory 913 (e.g., a cache). The processor 912 of the illustrated example is in communication with a main memory including a volatile memory 914 and a non-volatile memory 916 via a bus 918. The volatile memory 914 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 916 may be implemented by flash memory and/or any other desired type of memory device. Access to the main memory 914, 916 is controlled by a memory controller. In this example, the volatile memory 914 includes the memory parity generator 128.

The processor platform 900 of the illustrated example also includes an interface circuit 920. The interface circuit 920 may be implemented by any type of interface standard, such as an Ethernet interface, a universal serial bus (USB), a Bluetooth® interface, a near field communication (NFC) interface, and/or a PCI express interface.

In the illustrated example, one or more input devices 922 are connected to the interface circuit 920. The input device(s) 922 permit(s) a user to enter data and/or commands into the processor 912. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 924 are also connected to the interface circuit 920 of the illustrated example. The output devices 924 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 920 of the illustrated example, thus, typically includes a graphics driver card, a graphics driver chip and/or a graphics driver processor.

The interface circuit 920 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 926. The communication can be via, for example, an Ethernet connection, a digital subscriber line (DSL) connection, a telephone line connection, a coaxial cable system, a satellite system, a line-of-site wireless system, a cellular telephone system, etc.

The processor platform 900 of the illustrated example also includes one or more mass storage devices 928 for storing software and/or data. Examples of such mass storage devices 928 include floppy disk drives, hard drive disks, compact disk drives, Blu-ray disk drives, redundant array of independent disks (RAID) systems, and digital versatile disk (DVD) drives.

The machine executable instructions 932 of FIGS. 5, 6, and 8 may be stored in the mass storage device 928, in the volatile memory 914, in the non-volatile memory 916, and/or on a removable non-transitory computer readable storage medium such as a CD or DVD.

From the foregoing, it will be appreciated that example methods, apparatus and articles of manufacture have been disclosed that provide the greatest coverage for word-line and bit-line faults while allowing fault detection during the runtime of an application (e.g. used during runtime), whereas previous solutions could only be implemented during the start-up or shutdown of an application due to the destructive nature of prior solutions. Previous solutions are destructive because the memory must be disabled from functional use in order for the previous solution to carry out a full test uninterrupted. This significantly affects system performance because the memory that is being tested is not available for a substantial amount of time. Conversely, when using example methods, apparatus and articles of manufacture as disclosed herein, the memory is fully functional while monitoring for faults and system performance is not impaired as it is by the previous solutions. It will also be appreciated that the example methods, apparatus and articles of manufacture have been disclosed that provide adaptive, on-the-fly feedback for address information to the CPU. The disclosed methods, apparatus and articles of manufacture improve the efficiency of using a computing device by closing the loop between address information generation in the processor and address information use in the memory of a processing system. This allows for increased protection for faults that may occur between the initial generation of an address information and the decoding of that address information into specific word-line enable values and bit-line enable values. The disclosed methods, apparatus and articles of manufacture are accordingly directed to one or more improvement(s) in the functioning of a computer.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A system comprising:
   a processor including:
   an address generator configured to generate a first address information corresponding to a desired location to store data;
   a first parity generator to generate a first parity based on the first address information; and
   a parity checker;
   a memory including:
   a memory storage array;
   an address decoder coupled to the memory storage array at a first node by a set of word-lines and a set of bit-lines, wherein the address decoder is configured to receive the first address information and to energize a subset of the set of word-lines and the set of bit-lines in response to receiving the first address information;

an address encoder coupled to the memory storage array at a second node by the set of word-lines and the set of bit-lines, wherein the address encoder is configured to encode the subset of the set of word-lines and the set of bit-lines into a second address information; and a second parity generator coupled to the address encoder, wherein the second parity generator is configured to generate a second parity based on the second address information, the second address information representative of an actual location where the data was stored in the memory storage array; and wherein the parity checker compares the first parity and the second parity.

2. The system of claim 1, wherein the first parity includes a first parity bit determined from a first set of bits in the first address information and the second parity includes a second parity bit determined from a second set of bits in the second address information.

3. The system of claim 1, further comprising:
a fault located between the address generator and the memory storage array.

4. The system of claim 3, wherein the first address information corresponds to data operands in the processor.

5. The system of claim 4, wherein the data operands in the processor are input into the address generator.

6. The system of claim 1, wherein:
the parity checker determines whether the second address information matches the first address information; and
in response to determining the second address information does not match the first address information, determining a fault with storage of the data.

7. The system of claim 1, wherein the system may be used in conjunction with at least data parity, data and address parity, data error correcting code (ECC), or data and address ECC.

8. The system of claim 1, wherein the system may be used during runtime of an application.

9. The system of claim 3, wherein the system may detect the fault during at least start up or shut down of an application.

10. A method comprising:
generating, by an address generator in a processor, a first parity based on a first address information corresponding to a desired location to store data in a memory storage array;
decoding, by an address decoder in a memory, the first address information, wherein the address decoder is coupled to the memory storage array at a first node by a set of word-lines and a set of bit-lines;
energizing, by the address decoder, a subset of the set of word-lines and the set of bit-lines in response to receiving the first address information;
encoding, by an address encoder in the memory, the subset of the set of word-lines and the set of bit-lines into a second address information, wherein the address encoder is coupled to the memory storage array at a second node by the set of word-lines and the set of bit-lines;
generating, by a second parity generator in the memory, a second parity based on the second address information representative of an actual location where the data was stored in the memory storage array, wherein the second parity generator is coupled to the address encoder; and
comparing, by a parity checker, the first parity with the second parity.

11. The method of claim 10, wherein the first parity includes a first parity bit determined from a first set of bits in the first address information and the second parity includes a second parity bit determined from a second set of bits in the second address information.

12. The method of claim 10, further comprising:
based on a comparison between the first parity and the second parity, determining, by the processor, a fault located between the address generator and the memory storage array.

13. The method of claim 10, wherein the first address information corresponds to data operands in the processor.

14. The method of claim 13, wherein:
the data is stored in the memory storage array by energizing the subset of the set of word-lines and the set of bit-lines.

15. The method of claim 10, wherein the method may be used in conjunction with at least data parity, data and address parity, data error correcting code (ECC), or data and address ECC.

16. The method of claim 10, wherein the method may be used during runtime of an application.

17. The method of claim 16, wherein the method may detect a fault during at least one start up or shutdown of the application.

18. A non-transitory computer readable storage medium comprising instructions that, when executed, cause a processor to at least:
generate a first parity based on a first address information corresponding to a desired location to store data in a memory storage array;
compare a second parity based on a second address information corresponding to a set of word-lines and a set of bit-lines that were energized during storage of the data, the set of word-lines and the set of bit-lines representative of an actual location where the data was stored in the memory storage array;
wherein an address encoder is coupled to the memory storage array at a second node and the address encoder is configured to encode the set of word-lines and the set of bit-lines of the actual location where the data was stored in the memory storage array into the second address information; and
wherein the memory storage array is coupled to an address decoder at a first node, the address decoder configured to receive and decode the first address information; and
wherein the address decoder is configured to energize the set of word-lines and the set of bit-lines in response to receiving and decoding the first address information.

19. The non-transitory computer readable storage medium of claim 18, wherein the first parity includes a first parity bit determined from a first set of bits in the first address information and the second parity includes a second parity bit determined from a second set of bits in the second address information.

20. The non-transitory computer readable storage medium of claim 18, further comprising:
detect, based on a comparison between the first parity and the second parity, a fault located between an address generation unit and the memory storage array.

21. The non-transitory computer readable storage medium of claim 18, wherein the first address information corresponds to data operands in the processor.

22. The non-transitory computer readable storage medium of claim 20, wherein the instructions cause the processor to detect the fault during at least start up or shutdown of an application.

23. The non-transitory computer readable storage medium of claim 22, wherein the instructions cause the processor to detect the fault during runtime of the application.

24. The non-transitory computer readable storage medium of claim 18, wherein the instructions cause the processor to be used in conjunction with at least data parity, data and address parity, data error correcting code (ECC), or data and address ECC.

25. An apparatus comprising:
 a first parity generator configured to generate a first parity based on a first address information corresponding to a desired location to store data in a memory storage array, wherein the first address information is based on data operands in a processor; and
 a parity checker in the processor configured to:
  receive the first parity from the first parity generator;
  receive a second parity from a second parity generator in a memory, wherein the second parity is based on a second address information corresponding to a set of word-lines and a set of bit-lines that were energized during storage of the data in the memory storage array;
  wherein the set of word-lines and the set of bit-lines is representative of an actual location where the data was stored in the memory storage array,
  wherein the set of word-lines and the set of bit-lines couples an address decoder to the memory storage array at a first node, the address decoder configured to receive the first address information;
  wherein the set of word-lines and the set of bit-lines couples the memory storage array to an address encoder at a second node, the address encoder configured to output the second address information; and
  wherein the address encoder is coupled to the second parity generator; and
 compare the first parity and the second parity.

26. The apparatus of claim 25, wherein the first parity includes a first parity bit determined from a first set of bits in the first address information and the second parity includes a second parity bit determined from a second set of bits in the second address information.

27. The apparatus of claim 25, wherein the parity checker is configured to detect, based on a comparison between the first parity and the second parity, a fault is located between an address generation unit that generated the first address information and the memory storage array.

* * * * *